US009586071B2

(12) United States Patent
Johnson et al.

(10) Patent No.: US 9,586,071 B2
(45) Date of Patent: *Mar. 7, 2017

(54) COMPOSITIONS CONTAINING CHLOROFLUOROOLEFINS OR FLUOROOLEFINS

(71) Applicant: HONEYWELL INTERNATIONAL INC., Morristown, NJ (US)

(72) Inventors: Robert C. Johnson, Lancaster, NY (US); Hsueh S. Tung, Getzville, NY (US); Rajiv R. Singh, Getzville, NY (US); Ian Shankland, Randolph, NJ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/643,500

(22) Filed: Mar. 10, 2015

(65) Prior Publication Data

US 2015/0175867 A1 Jun. 25, 2015

Related U.S. Application Data

(60) Division of application No. 14/298,526, filed on Jun. 6, 2014, now Pat. No. 8,974,690, which is a continuation of application No. 13/862,517, filed on Apr. 15, 2013, now Pat. No. 9,095,737, which is a division of application No. 13/177,848, filed on Jul. 7, 2011, now Pat. No. 8,618,040, which is a division of application No. 12/368,094, filed on Feb. 9, 2009, now Pat. No. 7,985,299, which is a division of application No. 11/223,447, filed on Sep. 8, 2005, now Pat. No. 7,674,756, which is a continuation of application No. 10/700,696, filed on Nov. 4, 2003, now abandoned.

(51) Int. Cl.

| | |
|---|---|
| C09K 5/04 | (2006.01) |
| A62D 1/06 | (2006.01) |
| C11D 3/43 | (2006.01) |
| C11D 7/50 | (2006.01) |
| C11D 11/00 | (2006.01) |
| G03F 7/42 | (2006.01) |
| B01F 17/00 | (2006.01) |
| C09K 3/00 | (2006.01) |
| C09K 21/08 | (2006.01) |
| C23G 5/028 | (2006.01) |
| C11D 7/30 | (2006.01) |
| C08J 9/14 | (2006.01) |
| H05K 3/26 | (2006.01) |

(52) U.S. Cl.
CPC ............ *A62D 1/06* (2013.01); *B01F 17/0035* (2013.01); *C09K 3/00* (2013.01); *C09K 5/044* (2013.01); *C09K 5/045* (2013.01); *C09K 21/08* (2013.01); *C11D 3/43* (2013.01); *C11D 7/5018* (2013.01); *C11D 11/0047* (2013.01); *C23G 5/02809* (2013.01); *C23G 5/02825* (2013.01); *G03F 7/426* (2013.01); *C08J 9/144* (2013.01); *C09K 2205/102* (2013.01); *C09K 2205/104* (2013.01); *C09K 2205/12* (2013.01); *C09K 2205/122* (2013.01); *C11D 7/30* (2013.01); *H05K 3/26* (2013.01); *Y02C 20/30* (2013.01)

(58) Field of Classification Search
CPC ...................... C09K 2205/12; C09K 2205/122
See application file for complete search history.

(56) References Cited

U.S. PATENT DOCUMENTS

| | | | |
|---|---|---|---|
| 2,834,748 A | 5/1958 | Bailey et al. | |
| 2,846,458 A | 8/1958 | Haluska | |
| 2,917,480 A | 12/1959 | Bailey et al. | |
| 3,884,828 A | 5/1975 | Butler | |
| 4,788,352 A | 11/1988 | Smutny | |
| 4,945,119 A | 7/1990 | Smits et al. | |
| 5,152,845 A | 10/1992 | Li | |
| 5,710,352 A | 1/1998 | Tung | |
| 5,756,869 A | 5/1998 | Yoshikawa et al. | |
| 6,077,982 A | 6/2000 | Yates et al. | |
| 6,111,139 A | 8/2000 | Van Der Puy | |
| 6,300,378 B1 | 10/2001 | Tapscott | |
| 6,472,573 B1 | 10/2002 | Yamamoto et al. | |
| 6,516,837 B2 | 2/2003 | Thomas et al. | |
| 6,524,496 B2 | 2/2003 | Cook et al. | |
| 7,183,448 B2 | 2/2007 | Nakada et al. | |
| 7,674,756 B2 * | 3/2010 | Johnson ................... | C11D 3/43 510/177 |

(Continued)

FOREIGN PATENT DOCUMENTS

| | | |
|---|---|---|
| EP | 0347924 A1 | 12/1989 |
| EP | 0864554 A1 | 9/1998 |

(Continued)

OTHER PUBLICATIONS

Go Lu, M.D., et al., "Anesthesia. XLI: The Anesthetic Properties of Certain Fluorinated Bydrocarbons and Ethers," Anesthesia, LXI., vol. 14, pp. 466-472, Sep. 1953. US.

(Continued)

*Primary Examiner* — Gregory Webb

(74) *Attorney, Agent, or Firm* — Colleen D. Szuch

(57) ABSTRACT

Compositions and methods based on the use of fluoroalkene containing from 3 to 4 carbon atoms and at least one carbon-carbon double bond, such as HFO-1214, HFO—HFO-1233, or HFO-1354 having properties highly beneficial in foaming and blowing agent applications, articles and methods.

16 Claims, No Drawings

(56) References Cited

U.S. PATENT DOCUMENTS

| | | | |
|---|---|---|---|
| 7,985,299 B2* | 7/2011 | Johnson | C11D 3/43 134/38 |
| 8,618,040 B2* | 12/2013 | Johnson | C11D 3/43 252/67 |
| 8,974,690 B2* | 3/2015 | Johnson | C11D 3/43 252/67 |
| 9,095,737 B2* | 8/2015 | Johnson | C11D 3/43 |
| 2004/0119047 A1 | 6/2004 | Singh et al. | |
| 2005/0020862 A1 | 1/2005 | Tung et al. | |
| 2005/0119512 A1 | 6/2005 | Du Boisson et al. | |
| 2006/0014843 A1 | 1/2006 | Tanaka et al. | |
| 2006/0142173 A1* | 6/2006 | Johnson | C11D 3/43 510/407 |
| 2007/0102021 A1 | 5/2007 | Nappa et al. | |
| 2008/0157022 A1* | 7/2008 | Singh | C09K 5/045 252/68 |
| 2009/0318323 A1* | 12/2009 | Johnson | C11D 3/43 510/176 |
| 2011/0269861 A1* | 11/2011 | Johnson | C11D 3/43 521/131 |
| 2013/0228714 A1* | 9/2013 | Johnson | C11D 3/43 252/3 |
| 2014/0284510 A1* | 9/2014 | Johnson | C11D 3/43 252/8 |
| 2015/0175867 A1* | 6/2015 | Johnson | C11D 3/43 252/68 |

FOREIGN PATENT DOCUMENTS

| | | |
|---|---|---|
| JP | 2221368 A | 9/1990 |
| JP | 2221389 A | 9/1990 |
| JP | 2222469 A | 9/1990 |
| JP | 2222496 A | 9/1990 |
| JP | 2222497 A | 9/1990 |
| JP | 2222702 A | 9/1990 |
| JP | 3034941 | 2/1991 |
| JP | 05-179043 A | 7/1993 |
| JP | 06/087771 A | 3/1994 |
| WO | 90/08814 A1 | 8/1990 |
| WO | 91/01287 A1 | 2/1991 |
| WO | 02/059231 A2 | 8/2002 |
| WO | 2004/099109 A1 | 11/2004 |

OTHER PUBLICATIONS

Nelson P. Thomas, "Findings fo the Chlorofluorocarbon Chemical Substitutes International Committee," United States Environmental Protection Agency, EPA/600/86/009, May 1998, pp. 1-4, Air and Energy Engineering Research Laboratory, Triangle Park, NC US.

Research Disclosure 14623; Disclosed by E.I. du Pont de Nemours and Co., Inc., Organic Chemicals Department, Wilmington, DE, Jun. 1976, US.

Williams, David J., Declaration of David J. Williams, dated Aug. 9, 2013, US.

* cited by examiner

COMPOSITIONS CONTAINING CHLOROFLUOROOLEFINS OR FLUOROOLEFINS

CROSS REFERENCE TO RELATED APPLICATIONS

This application is a division of 14/298,526, filed Jun. 6, 2014, (now U.S. Pat. No. 8,974,690, issued Mar. 10, 2015), which is a continuation of U.S., application Ser. No. 13/862, 517, filed Apr. 15, 2013, which is a divisional of U.S. application Ser. No. 13/177,848, filed Jul. 7, 2011, (now U.S. Pat. No. 8,618,040, issued Dec. 31, 2013), which is a divisional of U.S. application Ser. No. 12/368,094, filed Feb. 9, 2009 (now U.S. Pat. No. 7,985,299, issued Jul. 26, 2011); which in turn is a divisional of U.S. application Ser. No. 11/223,447, filed Sep. 8, 2005 (now U.S. Pat. No. 7,674,756, issued Mar. 9, 2010), which in turn is a continuation-in-part of U.S. application Ser. No. 10/700,696, filed Nov. 4, 2003, (now abandoned), all of which are incorporated herein by reference.

FIELD OF THE INVENTION

This invention relates to compositions and systems having utility in numerous situations, including particular solvent cleaning systems, as well as refrigerant lubricants and/or compatibilizing agents, and to methods which utilize such compositions and systems, More particularly, the present invention in preferred aspects is directed to solvents, blowing agents, heat transfer fluids and compatibilizing agents comprising multi-fluorinated olefins.

BACKGROUND OF THE INVENTION

Solvent compositions are in widespread use throughout the world and in a wide variety of industrial applications. Certain fluorocarbons have been preferred components in solvent cleaning systems for many years. Trichlorotrifluoroethane has been one of the most widely used fluorocarbon solvents in recent years because it is generally effective as a solvent for many greases, oils, waxes and the like, and has therefore found widespread use for cleaning electric motors, compressors, heavy metal parts, delicate precision metal parts, printed circuit boards, gyroscopes, guidance systems, aerospace and missile hardware, aluminum parts and the like. Furthermore, trichlorotrifluoroethane is advantageous because it is nontoxic and nonflammable. Trichlorotrifluoroethane has two isomers: 1,1 2-trichloro-1 2,2-trifluoroethane (known in the art as CFC-113) and 1,1,1-trichloro-2,2, 2-trifluoroethane (known in the art as CFC-113a).

Concern has increased in recent years about potential damage to the earth's ozone layer, and certain chlorine-based compounds have been identified as particularly problematic in this regard. CFC-113 is chemically stable and therefore has a relatively long life in the straposphere, and since the use CFC-113 as a solvent will frequently result in its release into the environment, it will frequently reach the stratosphere. In the stratosphere, CFC-113 gives rise to photolysis under the influence of sun light to generate chlorine radicals. The thus generated chlorine radicals combine with ozone, resulting in ozone depletion. Accordingly, the use of organic chlorine-based compounds such as CFCs has been severely restricted in many countries of the world by governmental regulation. Because CFC-113 has a high ozone destruction potential, a need has risen to replace it, and other compounds which exhibit similar environmentally detrimental properties.

In response to the need for stratospherically safe materials, substitutes have been developed and continue to be developed. Research Disclosure 14623 (June 1978) reports that 1,1-dichloro-2,2,2-trifluoroethane (HCFC-123) is a useful solvent for degreasing and defluxing substrates. In the EPA "Findings of the Chlorofluorocarbon Chemical Substitutes International Committee", EPA-600/9-88-009 (April 1988), it was reported on pages C-22 and C-23 that HCFC-123 and 1-fluoro-1,1-dichloroethane (HCFC-141b) have potential as replacements for CFC-113 as cleaning agents. Other hydrochlorofluorocarbon alkanes (HCFC alkanes) have been developed as potential replacements for CFC-113, including for example 1,1-dichloro-2,2,2-trifluoroethane (HCFC-123), 1-fluoro-1,1-dichloroethane (HCFC-141b), 1,1-dichloro-2,2,3,3,3-pentafluoropropane (HCFC-225ca) and 1,3-dichloro-1,1,2,2,3-pentafluoropropane (HCFC-225cb).

The preparation and use of fluorinated higher alkenes, that is fluorine-substituted alkenes having at least five carbon atoms, is known For example, U.S. Pat. No. 4,788,352— Smutny is directed to production tri-fluorinated $C_5$ to $C_7$ compounds having at least some degree of unsaturation. Such higher olefins are identified as being known to have utility as refrigerants, pesticides, dielectric fluids, heat transfer fluids, solvents, and intermediates in various chemical reactions. (See column I lines 11-22).

However, while many of the hydrochlorofluorocarbons described heretofore may have substantial solvent power with respect to certain oils and fats, many also have certain disadvantages. For example, some of these compounds may tend to attack substrates, particularly general-purpose plastics such as acrylic resins and ABS resins. Furthermore, the higher olefinic compounds described in Smutny may also be undesirable in certain applications because of the potential level of toxicity of such compounds which may arise as a result of their activity as pesticides. Also, such compounds may not be sufficiently volatile to act as effective solvents in certain vapor degreasing operations, and the relatively low vapor pressure of such compounds may make it difficult to remove the solvent composition from the parts being cleaned.

Flammability is another important property for many applications. That is, it is considered either important or essential in many applications, including particularly in solvent cleaning applications, to use compositions which are non-flammable. Thus, it is frequently beneficial to use in such compositions compounds which are nonflammable. As used herein, the term 'nonflammable" refers to compounds or compositions which do not exhibit a flashpoint as measured by one of the standard flash point methods, for example ASTM-1310-86 'Flash point of liquids by tag Open-cup apparatus". Unfortunately, many HFC's which might otherwise be desirable for use in solvent compositions are not nonflammable. For example, the fluoroalkane pentafluorobutane (HFC-365) is flammable and therefore not viable for use in many applications.

In many applications it is also highly desirable for solvent compositions to be relatively stable, that is, to be relatively resistant to possible chemical changes during storage and use. Applicants have come to recognize that CFC-113 is deficient in this regard because it tends to hydrolyze and form HCl. Furthermore, this problem is worsened because metal, which is typically present during any solvent cleaning operations, acts as a catalyst and causes the hydrolysis of CFC-113 to increase dramatically:

Applicants have thus come to appreciate a need for solvent compositions that are potentially useful in numerous applications, including degreasing applications, precision cleaning and electronics cleaning applications, dry cleaning applications, solvent etching applications, as a solvent in aerosols or other sprayable compositions, as carrier solvents for depositing lubricants and release agents and other solvent or surface treatment applications.

SUMMARY OF THE INVENTION

Applicants have found that the above-noted and other needs can be satisfied, and many of the above-noted deficiencies and others can be overcome, by compositions comprising a compound having Formula I as follows:

where X is a $C_2$ or a $C_3$ unsaturated, chlorine and/or fluorine substituted alkyl group, each R is independently Cl, F, Br, I or H, and z is 1 to 3, preferably at least 2 and even more preferably at least 3. As used herein, the term "chlorine and/or fluorine substituted" means at least one chlorine and/or at least one fluorine substituent on the alkyl group X.

Applicants have also discovered methods and systems for removing contaminants from a product, part, component, substrate, or any other article or portion thereof by applying to the article a composition containing a compound in accordance with Formula I. For the purposes of convenience, the term "article" is used herein to refer to all such products, parts, components, substrates, and the like and is further intended to refer to any surface or portion thereof. Furthermore, the term "contaminant" is intended to refer to any unwanted material or substance present on the article, even if such substance is placed on the article intentionally. For example, in the manufacture of semiconductor devices it is common to deposit a photoresist material onto a substrate to form a mask for the etching operation and to subsequently remove the photoresist material from the substrate. The term "contaminant" as used herein is intended to cover and encompass such a photo resist material.

DETAILED DESCRIPTION OF PREFERRED EMBODIMENTS

The Compositions

The present invention is directed to compositions comprising at least one fluoroalkene containing from 3 to 4 carbon atoms and at least one carbon-carbon double bond. The fluoroalkene compounds of the present invention are sometimes referred to herein for the purpose of convenience as hydrofluoro-olefins or "HFOs" if they contain at least one fluorine and at least one hydrogen. It is intended that the term HFO also encompasses such compounds that also contain other substituents, such chlorine. Although it is contemplated that the HFOs of the present invention may contain two carbon—carbon double bonds, such compounds at the present time are not considered to be preferred.

The present compositions comprise one or more compounds in accordance with Formula 1. In preferred embodiments, the compositions include compounds of Formula II below

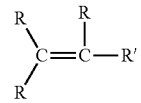

where each R is independently Cl, F, Br, 1 or H, wherein at least one R on an unsaturated carbon is chlorine and/or fluorine, R' is $(CR{-}_2)_n Y$, Y is $CRF_2$ and n is 0 or 1.

In highly preferred embodiments, Y is $CF_3$ and at least two unsaturated carbons have a chlorine substituent.

It is contemplated that all such compounds as identified above are adaptable for use in certain aspects of the present invention. The preferred compound(s) in accordance with the compositions and methods of the present invention preferably exhibit one or more, and preferably all, of the following properties: chemical stability; no substantial ozone depleting potential (ODP); relatively high degree of miscibility with common contaminants, particularly mineral oil and/or silicone oil; low or no flammability; low or no toxicity; and low or no global warming potential (GWP).

The preferred compounds for use in the present compositions have been found to possess at once several of these desirable beneficial properties. More specifically, the preferred compounds have: no substantial ozone depletion potential, preferably an ODP of not greater than about 0.5 and even more preferably of not greater than about 0.25, most preferably of not greater than about 0.1; a GWP of not greater than about 150, and even more preferably of not greater than about 50. In many of the preferred embodiments, the compound of the present invention has a normal boiling point of from about 20° C. to about 70° C., and even more preferably of from about 45° C. to about 60° C., and even more preferably from about 50° C. to about 60° C. It is also generally preferred that the compound(s) have no flash point as measured by one of the standard flash point methods, for example ASTM-1310-86 "Rash point of liquids by tag Open-cup apparatus" and an atmospheric lifetime of not greater than about 100 days and even more preferably of not greater about 50 days. Also, the preferred compound(s) are miscible with greater than 20% by weight of mineral oil and/or silicone oil, more preferably in a weight ratio in the range of at least about 80:20 to about 20:80, and even more preferably in substantially all proportions.

Preferred compounds of the present invention exhibit a relatively low toxicity value. Applicants have found that one compound within the scope of the present invention, namely HF0-1223xd (1,2-dichloro-3,3,3-trifluoropropene), is generally not desirable for use in connection with applications in which low or no toxicity is important. In certain preferred embodiments, therefore, the present composition and methods do not include any substantial amount of HFC-1223xd, and more preferably comprise one or more compounds within Formula I or Formula II which have an acute toxicity level, as hereinafter described, substantially less than, and preferably at least about 30 relative percent less than, HF0-1223xd.

As used herein, ODP is defined in the "Scientific Assessment of Ozone Depletion, 2002", a report of the World Meteorological association, incorporated here by reference. As used herein, GWP is defined relative to that of carbon dioxide and over a 100 year time horizon, and defined in the same reference as for the ODP mentioned above. As used herein, miscibility is measured in accordance with visual evaluation of phase formation or separation when two liquids are mixed together, as is known to those skilled in the art.

The compositions of the present invention thus generally possess properties and characteristics that are highly desirable for use in connection with many different applications, including many different types of cleaning and contaminant removal applications.

Cleaning Compositions

One of the most important characteristic of the present invention as it relates to cleaning applications is that the present compositions have been found to have a high level of solvent power for many common contaminants and residues while at the same time not having a high degree of acute toxicity, as measured by exposure to mice and rats. Preliminary toxicity for certain compounds within the scope of those described by Formula I above was published in Anesthesiology, Vol 14, pp 466-472, 1953.

In certain preferred embodiments, the solvent cleaning composition comprises a compound of Formula I or II having an acute toxicity level substantially less than, and preferably at least about 30 relative percent less than, the toxicity level of HFO-1223xd. In certain preferred embodiments, the solvent compositions of the present invention comprise, and preferably comprise at least about 50 percent by weight of, one or more substituted or unsubstituted $C_3$-$C_4$ tetrafluoroalkenes. In certain highly preferred embodiments, the solvent compositions of the present invention comprise dichloro-tetrafluoro-propenes, such as isomers of HFO-1214; chloro-trifluoro-propenes, such as isomers of HFO-1233; and tetrafluorobutenes, such as isomers of FIFO-1354. Specific examples of these compounds include 1,2-dichloro-1,3 3,3-tetrafluoro-1-propene ($CF_3$—CCl═CClF); 1-chloro-3,3,3-trifluoro-1-propene ($CF_3$_CH═CHCl); 2-chloro-3,3,3-trifluoro-1-propene ($CF_3$—CH═CHCl); 2,4,4,4-tetrafluoro-1-butene ($CF_3$—$CH_2$—CH═$CH_2$); 1,1,1,3-tetrafluoro-2-butene ($CH_3$—CH═CF—$CH_3$); and 1,1,3,3-tetrafluoro-1-butene ($CF_2$═CH—$CF_2$—$CH_3$). In certain preferred embodiments, solvents comprise a mixture of 1-chloro-3,3,3-trifluoro-1-propene and 2-chloro-3,3,3-trifluoro-1-propene or a mixture of one or more of 2 4,4,4-tetrafluoro-1-butene; 1,1,1,3-tetrafluoro-2-butene; and 1,1,3,3-tetrafluoro-1-butene.

One aspect of the present intervention thus provides surface treatment compositions comprising at least a substantial amount of at least one compound in accordance with Formula 1, more preferably Formula II, and even more preferably a compound in accordance with Formula I or II having an acute toxicity level substantially less than, and preferably at least about 30 relative percent less than, the toxicity level of HFO-1223xd. In certain embodiments, the present treatment compositions consist essentially of, and in some preferred embodiments consist of, one or more compounds in accordance with Formula I, more preferably Formula 11, and even more preferably a compound in accordance with Formula. I or II having an acute toxicity level substantially less than, and preferably at least about 30 relative percent less than, the toxicity level of HFO-1223xd. However, it is also contemplated that in many embodiments the composition will include other components in addition to the above-noted compounds. For example, it is contemplated that in certain embodiments the surface treating compositions may include co-solvents, anticorrosive agents, surfactants, stabilizers, inhibitors and other adjuvants which assist with or enhance the functionality of the composition. Examples of co-solvents include linear, branched and cyclic hydrocarbons, halocarbons, including chlorinated and brominated compounds, alcohols, such as methanol, ethanol, propanol, isopropanol, butanol, etc., ketones, esters, ethers and acetals. Examples of stabilizers include nitroalkanes, epoxy alkanes and phosphite esters. Some of these form azeotrope—like compositions with HFO-1214, HFO-1233, and/or HFO-1354.

Although it is contemplated that the compositions of the present invention may include the compounds of the present invention in widely ranging amounts, it is generally preferred that the solvent cleaning compositions of the present invention comprise a compound in accordance with Formula I, and even more preferably Formula II, in an amount that is at least about 10% by weight, and even more preferably at least about 30% by weight, of the composition.

In certain embodiments the present compositions are well adapted for used in the form of an aerosol and/or a sprayable composition, and in such embodiments it is contemplated that the present compositions may have one or more additives designed for this use, such as propellants, atomizing agents and the like.

Heat Transfer Compositions it is contemplated that when the compositions of the present invention are used in heat transfer applications, such compositions may include the compounds of the present invention in widely ranging amounts. It is generally preferred, however, that the heat transfer compositions of the present invention, especially the refrigerant compositions of the present invention, comprise compound(s) in accordance with Formula I, more preferably Formula II and even more preferably a compound in accordance with Formula I or II having an acute toxicity level substantially less than, and preferably at least about 30 relative percent less than, the toxicity level of HFO-1223xd, in an amount that is at least about 50% by weight, and even more preferably at least about 70% by weight, of the composition.

The heat transfer compositions of the present invention may include other components for the purpose of enhancing or providing certain functionality to the composition, or in some cases to reduce the cost of the composition. For example, refrigerant compositions according to the present invention, especially those used in vapor compression systems, include a lubricant, generally in amounts of from about 30 to about 50 percent by weight of the composition. Furthermore, the present compositions may also include a compatibilizer, such as propane, for the purpose of aiding compatibility and/or solubility of the lubricant. Such compatibilizers, including propane, butanes and pentanes, are preferably present in amounts of from about 0.5 to about 5 percent by weight of the composition. Combinations of surfactants and solubilizing agents may also be added to the present compositions to aid oil solubility, as disclosed by U.S. Pat. No. 6,516,837, the disclosure of which is incorporated by reference. Commonly used refrigeration lubricants such as Polyol Esters (POEs) and Poly Alkylene Glycols (PAGs) that are used in refrigeration machinery with hydrofluorocarbon (HFC) refrigerants may be used with the refrigerant compositions of the present invention.

For compatibilizing compositions of the present invention, it may be preferred to include in such compositions co-solvents, anticorrosive agents, surfactants, stabilizers and other adjuvants which assist with or enhance the functionality of the composition. For preferred compatibilizing compositions of the present invention, compound(s) in accordance with Formula I, more preferably Formula II, and even more preferably a compound in accordance with Formula I or II having an acute toxicity level substantially less than, and preferably at least about 30 relative percent less than, the toxicity level of HFO-1223xd, are present in an amount that is at least about 25% by weight, and even more preferably at least about 50% by weight, of the composition.

Blowing Agents, Foams and Foamable Compositions

Blowing agents may also comprise or constitute one or more of the present compositions. As mentioned above, the compositions of the present invention may include the compounds of the present invention in widely ranging amounts. It is generally preferred, however, that for preferred compositions for use as blowing agents in accordance with the present invention, compound(s) in accordance with Formula I, more preferably Formula. II, and even more preferably a compound in accordance with Formula I or II having an acute toxicity level substantially less than, and preferably at least about 30 relative percent less than, the toxicity level of HFO-1223xd, are present in an amount that is at least about 5% by weight, and even more preferably at least about 15% by weight, of the composition.

In other embodiments, the invention provides foamable compositions, and preferably polyurethane, polyisocyanurate and extruded thermoplastic foam compositions, prepared using the compositions of the present invention. In such foam embodiments, one or more of the present compositions are included as or part of a blowing agent in a foamable composition, which composition preferably includes one or more additional components capable of reacting and/or foaming under the proper conditions to form a foam or cellular structure, as is well known in the art. The invention also relates to foam, and preferably closed cell foam, prepared from a polymer foam formulation containing a blowing agent comprising the compositions of the invention, In yet other embodiments, the invention provides a foamable composition comprising thermoplastic foams, such as polystyrene and polyethylene (PE), preferably low density PE.

In certain preferred embodiments, dispersing agents, cell stabilizers, surfactants and other additives may also be incorporated into the blowing agent compositions of the present invention. Surfactants are optionally but preferably added to serve as cell stabilizers. Some representative materials are sold under the names of DC-193, B-8404, and L-5340 which are, generally, polysiloxane polyoxyalkylene block co-polymers such as those disclosed in U.S. Pat. Nos. 2,834,748, 2,917,480, and 2,846,458, each of which is incorporated herein by reference. Other optional additives for the blowing agent mixture may include flame retardants such as tri(2-chloroethyl)phosphate, tri(2-chloropropyl) phosphate, tri(2,3-dibromopropyl)-phosphate, tri(1,3-dichloropropyl)phosphate, diammonium phosphate, various halogenated aromatic compounds, antimony oxide, aluminum trihydrate, polyvinyl chloride, and the like.

Methods and Systems

The compositions of the present invention are useful in connection with numerous methods and systems, including: as a solvent in solvent cleaning methods, particularly vapor degreasing; heat transfer fluids in methods and systems for transferring heat, such as refrigerants used in refrigeration, air conditioning and heat pump systems; as a component in methods and systems for extinguishing and suppressing fire; as an additive to reduce the flammability of fluids; and as a component involved in the formation of foam, foam premixes, foam products and blowing agents for foams.

Cleaning Methods

The contaminant removal aspects of the present invention comprise contacting the contaminated article with at least one compound of the present invention. In preferred embodiments, the methods comprise applying a solvent composition of the present invention to the article containing the contaminant, with vapor degreasing and solvent cleaning methods being particularly preferred for certain applications, especially those especially intricate parts and difficult to remove soils. As those skilled in the art will appreciate, the present methods have applicability to a wide variety of different cleaning and residue removal techniques, and all such techniques are within the broad scope of the present invention.

Preferred methods of the present invention comprise applying the present composition to the article, with vapor degreasing and solvent cleaning methods being particularly preferred for certain applications, especially those involving intricate parts and difficult to remove soils. Preferred vapor degreasing and solvent cleaning methods consist of exposing an article, preferably at room-temperature, to the vapors of a boiling solvent. Vapors condensing on the object have the advantage of providing a relatively clean, distilled solvent to wash away grease or other contamination. Such processes thus have an additional advantage in that final evaporation of the present solvent composition from the object leaves behind relatively little residue as compared to the case where the object is simply washed in liquid solvent.

For applications in which the article includes contaminants that are difficult to remove, it is preferred that the present methods involve raising the temperature of the solvent composition of the present invention above ambient or to any other temperature that is effective in such application to substantially improve the cleaning action of the solvent. Such processes are also generally preferred for large volume assembly line operations where the cleaning of article, particularly metal parts and assemblies, must be done efficiently and quickly.

In preferred embodiments, the cleaning methods of the present invention comprise immersing the article to be cleaned in liquid solvent at an elevated temperature, and even more preferably at about the boiling point of the solvent. In such operations, this step preferably removes a substantial amount, and even more preferably a major portion, of the target contaminant from the article. This step is then preferably followed by immersing the article in solvent, preferably freshly distilled solvent, which is at a temperature below the temperature of the liquid solvent in the preceding immersion step, preferably at about ambient or room temperature. The preferred methods also include the step of then contacting the article with relatively hot vapor of the present solvent composition, preferably by exposing the article to solvent vapors rising from the hot/boiling solvent associated with the first mentioned immersion step. This preferably results in condensation of the solvent vapor on the article. In certain preferred embodiments, the article may be sprayed with distilled solvent before final rinsing.

It is contemplated that numerous varieties and types of vapor degreasing equipment are adaptable for use in connection with the present methods. One example of such equipment and its operation is disclosed by Sherliker et al. in U.S. Pat. No. 3,085,918, which is incorporated herein by reference. The equipment disclosed in Sherliker et al includes a boiling sump for containing a solvent composition, a clean sump for containing distilled solvent, a water separator, and other ancillary equipment.

The present cleaning methods may also comprise cold cleaning in which the contaminated article is either immersed in the fluid composition of the present invention under ambient or room temperature conditions or wiped under such conditions with rags or similar objects soaked in solvents. In addition, the present methods may comprise or consist essentially of applying the present composition to the article by spraying the composition onto the article.

Heat Transfer Methods

The preferred heat transfer methods generally comprise providing a composition of the present invention and causing heat to be transferred to or from the composition changing the phase of the composition. For example, the present methods provide cooling by absorbing heat from a fluid or article, preferably by evaporating the present refrigerant composition in the vicinity of the body or fluid to be cooled to produce vapor comprising the present composition. Preferably the methods include the further step of compressing the refrigerant vapor, usually with a compressor or similar equipment to produce vapor of the present composition at a relatively elevated pressure. Generally, the step of compressing the vapor results in the addition of heat to the vapor, thus causing an increase in the temperature of the relatively high pressure vapor. Preferably, the present methods include removing from this relatively high temperature, high pressure vapor at least a portion of the heat added by the evaporation and compression steps. The heat removal step preferably includes condensing the high temperature, high pressure vapor while the vapor is in a relatively high pressure condition to produce a relatively high pressure liquid comprising a composition of the present invention. This relatively high pressure liquid preferably then undergoes a nominally isoenthalpic reduction in pressure to produce a relatively low temperature, low pressure liquid. In such embodiments, it is this reduced temperature refrigerant liquid which is then vaporized by heat transferred from the body or fluid to be cooled.

In another process embodiment of the invention, the compositions of the invention may be used in a method for producing heating which comprises condensing a refrigerant comprising the compositions in the vicinity of a liquid or body to be heated. Such methods, as mentioned hereinbefore, frequently are reverse cycles to the refrigeration cycle described above.

The present invention also includes the use of the present compositions in connection with heat transfer methods comprising adding and/or removing sensible heat from the present compositions, preferably by bringing the present composition into convective or conductive heat transfer relationship with an article or fluid to be heated or cooled_ Such contact is most preferably indirect contact, such as would occur through the present composition being exposed to a heat transfer surface located on one side of a fluid transfer barrier. Typically, the article or fluid to be cooled or heated is located on the other side of such a barrier but in contact with a surface that is thermodynamically coupled to the heat transfer surface in contact with the composition of the present invention. Finned tube heat exchangers are common example of such an apparatus, which also may be used in connection with phase change heat transfer as discussed above.

Flammability Reduction Methods

According to certain other preferred embodiments, the present invention provides methods for reducing the flammability of fluids, said methods comprising adding a compound or composition of the present invention to said fluid. The flammability associated with any of a wide range of otherwise flammable fluids may be reduced according to the present invention. For example, the flammability associated with fluids such as ethylene oxide, flammable hydrofluorocarbons and hydrocarbons, including: HFC-365, hexane, octane, and the like can be reduced according to the present invention. For the purposes of the present invention, a flammable fluid may be any fluid exhibiting flammability ranges in air as measured via any standard conventional test method, such as ASTM E-681, and the like.

Any suitable amounts of the present compounds or compositions may be added to reduce flammability of a fluid according to the present invention. As will be recognized by those of skill in the art, the amount added will depend, at least in part, on the degree to which the subject fluid is flammable and the degree to which it is desired to reduce the flammability thereof. In certain preferred embodiments, the amount of compound or composition added to the flammable fluid is effective to render the resulting fluid substantially non-flammable.

Flame Suppression Methods

The present invention further provides methods of suppressing a flame, said methods comprising contacting a flame with a fluid comprising a compound or composition of the present invention. Any suitable methods for contacting the flame with the present composition may be used. For example, a composition of the present invention may be sprayed, poured, and the like onto the flame, or at least a portion of the flame may be immersed in the composition. In light of the teachings herein, those of skill in the art will be readily able to adapt a variety of conventional apparatus and methods of flame suppression for use in the present invention.

Foam Blowing Methods

One embodiment of the present invention relates to methods of forming foams, and preferably polyurethane and polyisocyanurate foams. The methods generally comprise providing a blowing agent composition of the present inventions, adding (directly or indirectly) the blowing agent composition to a foamable composition, and reacting the foamable composition under the conditions effective to form a foam or cellular structure, as is well known in the art. Any of the methods well known in the art, such as those described in "Polyurethanes Chemistry and Technology," Volumes I and II, Saunders and Frisch, 1962, John Wiley and Sons, New York, N.Y., which is incorporated herein by reference, may be used or adapted for use in accordance with the foam embodiments of the present invention. In general, such preferred methods comprise preparing polyurethane or polyisocyanurate foams by combining an isocyanate, a polyol or mixture of polyols, a blowing agent or mixture of blowing agents comprising one or more of the present compositions, and other materials such as catalysts, surfactants, and optionally, flame retardants, colorants, or other additives.

It is convenient in many applications to provide the components for polyurethane or polyisocyanurate foams in pre-blended formulations. Most typically, the foam formulation is pre-blended into two components. The isocyanate and optionally certain surfactants and blowing agents comprise the first component, commonly referred to as the "A" component. The polyol or polyol mixture, surfactant, catalysts, blowing agents, flame retardant, and other isocyanate reactive components comprise the second component, commonly referred to as the "B" component. Accordingly, polyurethane or polyisocyanurate foams are readily prepared by bringing together the A and B side components either by hand mix for small preparations and, preferably, machine mix techniques to form blocks, slabs, laminates, pour-in-place panels and other items, spray applied foams, froths, and the like. Optionally, other ingredients such as fire retardants, colorants, auxiliary blowing agents, and even other polyols can be added as a third stream to the mix head or reaction site. Most preferably, however, they are all incorporated into one B-component as described above.

It is also possible to produce thermoplastic foams using the compositions of the invention. For example, conventional polystyrene and polyethylene formulations may be combined with the compositions in a conventional manner to produce rigid foams.

What is claimed is:

1. A heat transfer system comprising a heat transfer composition having low or no acute toxicity comprising:
   (a) lubricant;
   (b) at least one flammable component selected from hydrofluorcarbons and hydrocarbons;
   (b) at least about 50% by weight of one or more compounds in accordance with Formula II:

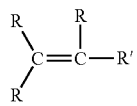
(II)

where R' is —CF$_3$ and each R is independently Cl, F or H, provided that at least one R on the unsaturated terminal carbon is chlorine, and wherein (i) said one or more compounds of Formula II include no substantial amount of 1,2-dichloro-3,3,3-trifluoropropene, (ii) the acute toxicity level of said one or more compounds of Formula II is at least 30 relative percent less than the acute toxicity level of 1,2-dichloro-3,3,3-trifluoropropene; and (iii) said at least one compound of Formula II reduces the flammability of said heat transfer composition; and
   (c) wherein the acute toxicity level of the composition is at least 30 relative percent less than the acute toxicity level of 1,2-dichloro-3,3,3-trifluoropropene.

2. The system of claim 1 wherein said lubricant comprises mineral oil.

3. The system of claim 2 wherein said mineral oil is present in said composition in an amount of at least about 20% by weight.

4. The system of claim 2 wherein said wherein said lubricant consists essentially of said mineral oil.

5. The system of claim 1 wherein said composition of claim 1 wherein said one or more compounds of Formula II comprises 1-chloro-3,3,3-trifluoro-1-propene.

6. The system of claim 5 wherein said 1-chloro-3,3,3-trifluoro-1-propene is present in the composition in amount of at least about 20% by weight.

7. The composition of claim 5 wherein said 1-chloro-3,3,3-trifluoro-1-propene is present in the composition in amount of at least about 30% by weight.

8. The composition of claim 5 wherein said 1-chloro-3,3,3-trifluoro-1-propene is present in the composition in amount of at least about 50% by weight.

9. The composition of claim 8 wherein said composition consists essentially of said lubricant and said 1-chloro-3,3,3-trifluoro-1-propene.

10. The system of claim 1 wherein said lubricant comprises polyol ester.

11. The system of claim 1 wherein said lubricant comprises poly alkylene glycol.

12. The system of claim 4 wherein said 1-chloro-3,3,3-trifluoro-1-propene and said mineral oil are miscible in substantially all proportions.

13. The system of claim 1 wherein said flammable component comprises one or more of a propane, a butane, or a pentane.

14. An air conditioning system comprising the system of claim 1.

15. An air conditioning system comprising the system of claim 10.

16. An air conditioning system comprising the system of claim 11.

* * * * *